United States Patent [19]

Verkroost et al.

[11] 4,095,276
[45] June 13, 1978

[54] DIGITAL SIGNAL PROCESSING ARRANGEMENT INCLUDING A WAVE DIGITAL FILTER

[75] Inventors: Gerard Verkroost, Mierlo; Hans-Jurgen Butterweck, Geldrop, both of Netherlands

[73] Assignee: U.S. Philips Corporation, New York, N.Y.

[21] Appl. No.: 751,548

[22] Filed: Dec. 16, 1976

[30] Foreign Application Priority Data

Dec. 22, 1975 Netherlands .................... 7514908

[51] Int. Cl.² .................... G06F 15/34; H03H 7/10
[52] U.S. Cl. .................... 364/724; 333/70 R; 364/745
[58] Field of Search ............ 235/152, 156; 333/70 R; 328/167

[56] References Cited

U.S. PATENT DOCUMENTS

| 3,919,671 | 11/1975 | Fettweis | 333/70 R |
| 3,967,099 | 6/1976 | Fettweis | 235/152 |
| 3,980,872 | 9/1976 | Fettweis | 235/152 |
| 3,997,770 | 12/1976 | Claasen et al. | 235/152 |

OTHER PUBLICATIONS

H. J. Butterweck, "Suppression of Parasitic Oscillations in Second-Order Digital Filters by Means of a Controlled-Rounding Arithmetic" Archiv fur Elektronik und Übertragungstechnik, Band 29–Heft, Sep. 1975, pp. 371–374.

A. Fettweis et al., "On Adaptors for Wave Digital Filters" IEEE Trans. on Acoustics, Speech & Signal Processing, vol. ASSP-23, No. 6, Dec. 1975, pp. 516–525.

*Primary Examiner*—David H. Malzahn
*Attorney, Agent, or Firm*—Frank R. Trifari; Daniel R. McGlynn

[57] ABSTRACT

A digital signal processing arrangement including a wave digital filter having quantizing means for limiting the signal waves present to a predetermined word length by means of controlled rounding. "Controlled rounding" means that a limit-cycle-free output signal is obtained when a constant input signal is present. If the outgoing signal waves from the N-port adaptor are equal to $b_o(j,k)$, and the signal waves applied to the adaptor are equal to $a(j,k)$, $b(j,k)$ is equal the desired and quantized value of $b_o(j,k)$, where $j$ represents the number of the port, then the process of controlled rounding quantizes $b_o(j,k)$ in such a way that $$|b(j,k) - \sum_{i=1}^{r} c(i,j)a(i,k)| \leq |b_o(j,k) - \sum_{i=1}^{r} c(i,j)a(i,k)|$$

Here the $c(i,j)$ represent constant coefficients, and $r$ the number of independent information signal waves.

8 Claims, 8 Drawing Figures

N-PORT ADAPTOR

DIGITAL SIGNAL PROCESSING ARRANGEMENT INCLUDING A WAVE DIGITAL FILTER

TABLE OF CONTENTS

A. BACKGROUND OF THE INVENTION
 1. Field of the Invention.
 2. Description of the prior art.
B. SUMMARY OF THE INVENTION
C. BRIEF DESCRIPTION OF THE DRAWING
D. REFERENCES
E. DESCRIPTION OF THE PREFERRED EMBODIMENTS
 1. Identifying the system sections.
 2. General discussion of wave digital filters.
 3. Stabilizing the wave digital filter by means of controlled rounding.
 4. Determining the constant signal waves $b(j)$.
F. THE CONCRETE EMBODIMENT OF THE FIGS. 3 AND 4
G. THE QUANTIZER ARRANGED FOR "CONTROLLED ROUNDING"
H. EXTENSION OF THE FIELD OF APPLICATION OF "CONTROLLED ROUNDING"
I. GENERAL REMARKS

BACKGROUND OF THE INVENTION

1. Field of the Invention

The invention relates to a digital signal processing arrangement comprising a wave digital filter including at least one N-port adaptor with port $P(i)$, ($i = 1, 2, \ldots$ N), at least one of the ports $P(i)$ being of the purely capacitive or purely inductive type, digital information signal waves $a(1,k)$, $a(2,k)$, $\ldots a(r,k)$ being applied to said filter through each of $r$ ports ($r<N$) auxiliary digital signal waves $a(i,k)$ where $i = r+1, \ldots N$ being applied to said digital filter through the remaining ports, said digital filter comprising quantizing means for producing a digital output signal wave $b(j,k)$ quantized at a predetermined word length at port $P(j)$.

In the technical literature (see section D) digital filters of the wave type are known by the name "Wave Digital Filters" which designation will be used hereinafter.

2. Description of the Prior Art

As known, wave digital filters are derived from conventional LC filters by means of transmission line transformations and the introduction of a new frequency variable in accordance with the concept described in reference 1 (see section D), the so-called Richards transformation. The conventional LC filter from which the wave digital filter is derived is called the reference filter.

A purely capacitive port must here be understood to mean a port which is equivalent to a capacitance in the reference filter, across which capacitance a voltage is produced which does not originate from a capacitive voltage division of the input voltage of the reference filter.

A purely inductive port must here be understood to mean a port which is equivalent to an induction in the reference filter, whereby the current flowing through this induction does not originate from a distribution of a current over two parallel branches one of which comprising the induction.

In a wave digital filter discrete instantaneous values of a signal wave $a(j,t)$ are processed ($j = 1, 2, 3, \ldots N$).

These discrete instantaneous values occur time-discrete. These time and amplitude-discrete signal waves will be indicated hereinafter as digital signal waves $a(j,k)$ or, for short, as signal wave $a(j)$, (see reference 7). In the filter the signal waves $a(j)$ are multiplied by factors $\gamma(m)$; $m$ represents the number of the multiplier. Furthermore the signal waves $a(j)$ and the multplication factors $\gamma(m)$ are represented by numbers in the binary system. These numbers consist of a plurality of binary digits or bits. The number of bits of a number is also called the word length of the number. If a signal wave $a(j)$ is multiplied by a multiplication factor $\gamma(m)$ a product $z(n) = a(j) \cdot \gamma(m)$ is obtained whose word length exceeds that of one of the two numbers $a(j)$ or $\gamma(m)$. Usually the word length of the product $z(n)$ is equal to the sum of the number of bits of the numbers $a(j)$ and $\gamma(m)$. For further processing of such a product $z(n)$ its word-length is reduced to the desired number of bits; for example by means of rounding.

In a wave digital filter, as with recursive digital filters, word length reduction may result in that instabilities are produced. Such instabilities which are in the form of parasitic oscillations are known in the literature as "Limit cycles". These parasitic oscillations can be divided into two groups.

I. Those parasitic oscillations which occur under zero-input conditions.

II. Those parasitic oscillations which occur if the input signal of the filter is time-independent and unequal to zero.

In reference 5 (see section D), it is already indicated that in a wave digital filter the parasitic oscillations belonging to category I can be avoided by converting the output wave $b_o(j)$ of the $j^{th}$ gate ($j = 1, \ldots N$) into an output signal wave $b(j)$, whereby the word length of $b(j)$ is smaller than the word length of $b_o(j)$ and whereby the absolute value of $b(j)$ satisfies the equation $|b(j)| \leq |b_o(j)|$. Supression of parasitic oscillations belonging to category I can be done in a particularly simple manner namely by means of "magnitude truncation".

Reference 6 also discloses that limit cycles belonging to category I can be avoided by using so-called active quantization instead of magnitude truncation, which is here called passive quantization. With active quantization the absolute value of the signal $b_o(j)$ to be quantized is continuously rounded upwards. Furthermore, this reference also proposes to perform a passive or an active quantization on the signal wave $b_o(j)$, depending on the absolute value of the signal wave $b_o(j)$.

SUMMARY OF THE INVENTION

It is an object of the invention to provide a digital signal processing arrangement comprising a wave digital filter which is provided with quantizing mans which are arranged to prevent the occurrence of parasitic oscillations which belong to category II.

To that end, in accordance with the invention said quantizing means are arranged to produce at each of the purely capacitive or purely inductive port $P(j)$ such a digital output signal wave $b(j,k)$ that each $b(j,k)$ satisfies the expression $$\left| b(j,k) - \sum_{i=1}^{r} c(i,j) \cdot a(i,k) \right| \leq \left| b_o(j,k) - \sum_{i=1}^{r} c(i,j) a(i,k) \right|$$

wherein $c(n,j)$ with $n = 0, 1, 2, \ldots r$ represents a constant which characterizes the $j^{th}$ purely capacitive port and $b_o(j,k)$ represents a non-quantized version of the digital output signal wave $b(j,k)$.

When only one information signal wave $a(1,k)$ is applied to the filter and when $c(i,j) = 1$, then the quantized value $b(j,k)$ is nearer to a $a(1,k)$ than the non-quantized value $b_o(j,k)$; at least, $b(j,k)$ is not further removed from $a(1,k)$ than $b_o(j,k)$. More particularly, $b_o(j,k)$ is rounded upwards if $a(1,k) > b_o(j,k)$ and $b_o(j,k)$ is rounded downwards if $a(1,k) < b_o(j,k)$. When in a particular case $a(1,k) = b_o(j,k)$ which means that $b_o(j,k)$ has already been quantized to the correct value then no rounding is applied to $b_o(j,k)$.

Rounding of $b_o(j,k)$ towards a $(1,k)$ as described above will be referred to as "controlled rounding".

For a large number of wave digital filters which are each determined by a specific transfer characteristic and for any values of time-independent input signal waves $a(1,k)$ it has been proved that no parasitic oscillations which belong to the category II are produced anymore.

REFERENCES

1. Resistor-Transmission-line Circuits; P.I. Richards; Proceedings of the I.R.E., February 1948, pages 217–220.
2. Digital Filter Structures Related to Classical Filter Networks; A. Fettweis; Archiv fur Elektrische Uebertragungstechnik (AEU) Band 25 (1971), Heft 2; pages 79–89.
3. On the design of Wave Digital Filters with low Sensitivity Properties; K. Renner, S. C. Gupta; IEEE Transactions on Circuit Theory, Vol. CT-20, No. 5, September 1973, pages 555–567.
4. On the Design of Wave Digital Filters with a Minimum Number of Multipliers; K. Renner, S. C. Gupta; IEEE Transactions on circuits and Systems, Vol. CAS-21, No. 1, January 1974; pages 137–145.
5. Supression of Parasitic Oscillations in Wave Digital Filters; A. Fettweis, k. Meerkotter; IEEE Transactions on Circuits and Systems, CAS-22, No. 3, March 1975; pages 239–246.
6. Chopping Operations in Wave Digital Filters; M. J. J. C. Annegarn; Electronics Letters, 7th August 1975, Vol. 11, No. 16, pages 378–379.
7. Terminology in Digital Signal Processing; L. R. Rabiner et al; IEEE Transactions on Audio and Electroacoustics, Vol. AU-20, No. 5, December 1972; pages 322–337.
8. Electronic Circuits, Signals and Systems; S. J. Mason, H. J. Zimmerman; John Wiley New York 1960, page 114.

DESCRIPTION OF THE PREFERRED EMBODIMENTS.

(E.1) Identifying the system sections

Figure 1:
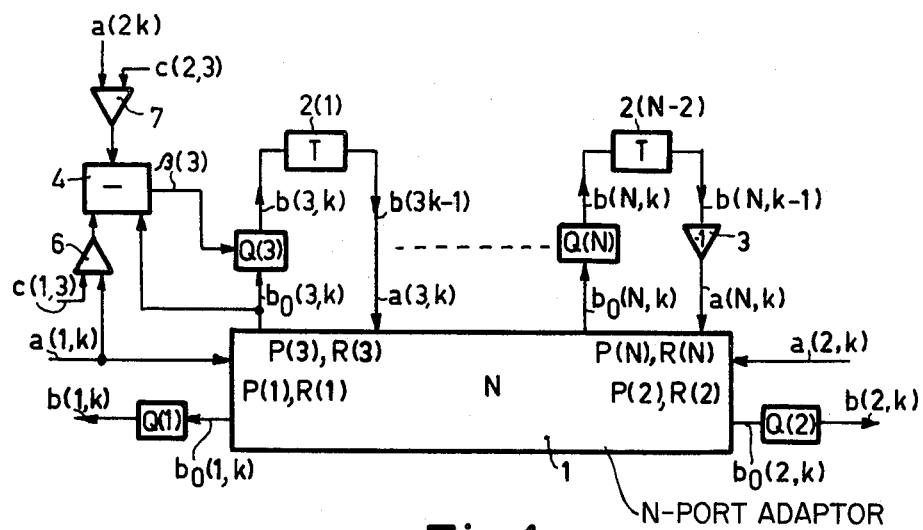
FIG. 1 shows diagrammatically a wave digital filter according to the invention.

FIG. 1 shows diagrammatically a Wave Digital Filter (see also reference 2). It comprises an N-port adaptor 1 with ports P(1), P(2), ... P(N). Each of these ports has an input to which a digital signal wave $a(j,k)$ is applied. $a(j,k)$ represents a digitally-coded sample of a signal wave $a(j,t)$ at the instant $kT$ at the input of the port $P(j)$. T represents the sampling period. Furthermore, $k$ is an integer and $j = 1, 2, 3, \ldots N$. Each of the ports P(.) is also provided with an output at which signals occur which are indicated by $b_o(j,k)$ in FIG. 1. Again $j = 1, 2, 3, \ldots N$ and the meaning of K is the same as for $a(j,k)$.

The ports P(1), ..., P(N) each have a so-called port resistance R(N), R(2), ... R(N) respectively. These port resistances are related to the values of the capacitances and inductions in the reference filter. As indicated in reference 2, the port resistance for a capacitive port $P(i)$ is equal to $R(i) = 1/C(i)$ and for an inductive port $P(j)$ equal to $R(j) = L(j)$.

The respective digital input signal waves $a(1,k)$ and $a(2,k)$ are applied to the port P(1) and P(2) and at these ports output signal waves $b_o(1,k)$ and $b_o(2,k)$ respectively are produced. The inputs and the outputs of the remaining ports P(3), ... P(N) are coupled to one another through the respective storage sections 2(1), ... 2(N-2) which each have a storage time $_T$.

FIG. 1 also shows a capacitive port P(3) and an inductive port P(N) with the respective port-resistances $R(3) = 1/C(3)$ and $R(N) = L(N)$. These ports are different from one another (see reference 2) in that at port P(3) the input signal wave $a(3,k)$ has the same polarity as the output signal wave $b_o3,k-1)$, while the input signal wave $a(N,k)$ at the inductive port P(N) is obtained by reversing the polarity of the signal wave $b_o(N,k-1)$. In the figure this reversal is diagrammatically shown by the multiplier 3. In this multiplier the output signal of the delay section 2(N-2) is multiplied by a factor minus one $(-1)$.

As the N-port adaptor 1 performs a linear and storage-free processing of the input signal waves $a(j,k)$ where $j = 1, 2, \ldots N$ every output signal wave $b_o(i,k)$ may be written as a linear combination of the signal waves $a(j,k)$ according to $$b_o(i,k) = \sum_{j=1}^{N} s(i,j)\, a(j,k) \qquad (1)$$

In this expression $s(i,j)$ represents a system $(j = 1, 2, \ldots N)$ of multiplication factors which are characteristic for the port $P(i)$.

Since the multiplications which must be performed in the N-port 1 in accordance with expression (1) the number of bits of the signal waves $b_o(i,k)$ is, in general, considerably larger than the number of bits of the signal waves $a(j,k)$ and the multiplication factors $s(i,j)$. As a rule the number of bits of $b_o(i,k)$ will be equal to the sum of the number of bits of $a(j,k)$ and $s(i,j)$. In order to limit the capacity of the storage sections 2(1), ... 2(N-2) and to enable the devices such as adders and multipliers included in the N-port 1 to be constructed with standard components the word length of each of the output signal waves $b_o(i,k)$ must on the one hand be adapted to the storage capacity of the storage sections 2(.). On the other hand the word length of the signal waves $a(j,k)$ where $J = 1, 2, \ldots, N$ must be constant. To that end the wave digital filter comprises means to produce an output signal wave $b(i,k)$ at the port $P(i)$, the word length of $b(i,k)$ being adapted to the capacity of the storage section $2(i)$; $i = 1, 2, \ldots, N-2$. In the wave digital filter shown in FIG. 1 a quantizing device Q(1), ... Q(N) is therefore included in each of the outputs associated with the ports $P(1), \ldots, P(N)$. Each of these quantizers $Q(j)$ now limits the wordlength of the relevant output signal wave $b_o(j,k)$ to a predetermined number of bits and produces the quantized output signal wave $b(j,k)$.

As already stated in section (A) (2) word length reduction of $b_o(i,k)$ where $i = 3, \ldots, N$ may result in the generation of parasitic oscillations. Those parasitic oscillations which below to category II, that is to say which are generated in the information signal waves applied to the wave digital filter are constant, are suppressed, because at each purely capacitive port, (such as for example P(3) in FIG. 1) the quantizer Q(3) is controlled by a control signal $\beta(3)$ which is produced by a subtractor 4. To this subtractor are applied the signal wave $b_o(3,k)$ to be quantized, the information signal wave $a(1,k)$ through a multiplier 6 and the information signal wave $a(2,k)$ through a multiplier 7. Multiplication factors which will be indicated by: c(1,3), c(2,3) are respectively applied to the multipliers 6 and 7. The output signal $\beta(3)$ of the subtractor is now given by:
$\beta(3) = b_o(3,k) - c(1,3)a(1,k) - c(2,3)a(2,k)$.

The quantizer Q(3) is now arranged for rounding the signal wave $b_o(3,k)$ either downwards or upwards depending on $\beta(3)$ so that at all times:

$$|b(3,k) - c(1,3)a(1,k) - c(2,3)a(2,k)| \leq |b_o(3,k) - c(1,3)a(1,k) - c(2,3)a(2,k)| \quad (2)$$

This means that $b_o(3,k)$ is rounded upwards if $\beta(3)$ is negative. If to the contrary $\beta(3)$ is positive then $b_o(3,k)$ is rounded downwards while no rounding of $b_o(3,k)$ takes place if $\beta(3) = 0$.

In section (E.4) it will be shown that in bandpass and highpass filters for a purely capacitive port and with constant values of the information signal waves $a(1,k)$ and $a(2,k0$ the value of $c(1,3)a(1,k) + c(2,3)a(2,k)$ is equal to the steady state voltage across the relevant capacitance in the reference filter. This value can be represented in a code word of the desired length even without quantization. In this connection the meaning of expression (2) then is that the quantizer reduces each time the difference between the instantaneous voltage across the capacitance (expressed by $b_o(3,k)$) and the voltage across the capacitance in the steady state condition. If in the steady-state condition of the reference filter the voltage across the capacitance can be exactly expressed in a code word of the desired length then the quantized signal wave $b(3,k)$ will be exactly equal to this voltage after a given time.

(E.2) GENERAL DISCUSSION OF WAVE DIGITAL FILTERS

In general the quantization which is applied by quantizer $Q(j)$ may be defined as:

$$b(j,k) = Q_j[b_o(j,k)] \quad (3)$$

or $$b(k) = Q[b_o(k)] \quad (4)$$

In this expression (4) $b(k)$ and $b_o(k)$ denote vectors with components $b(j,k)$ and $b_o(j,k)$ respectively. If furthermore a vector $a(k)$ is defined with components $a(j,k)$ (see chapter (E) (1)), where $j = 1, 2$, whereby the components $a(1,k)$ and $a(2,k)$ denote the information signal waves, the N-port 1 of FIG. 2 yields the linear relation:

$$b_o(k) = S \cdot a(k) = \begin{bmatrix} s_{11} & s_{12} & s_{13} & \cdots & s_{1N} \\ s_{21} & s_{22} & s_{23} & \cdots & s_{2N} \\ \cdot & \cdot & \cdot & & \cdot \\ \cdot & \cdot & \cdot & & \cdot \\ \cdot & \cdot & \cdot & & \cdot \\ s_{N1} & s_{N2} & s_{N3} & \cdots & s_{NN} \end{bmatrix} \begin{bmatrix} a(1,k) \\ a(2,k) \\ \cdot \\ \cdot \\ \cdot \\ a(N,k) \end{bmatrix} \quad (5)$$

In this relation S represents a constant $N \times N$ matrix. At the ports $P(j)$ where $j = 3+1, \ldots, N$ of a wave digital filter the condition $$a(j,k) = \pm b(j,k-1) \quad (6)$$

is satisfied. The expression (4), (5) and (6) now uniquely determine the unknown respond vectors $a(k)$, $b_o(k)$ and $b(k)$ if the known information signal waves $a(1,k)$ and $a(2,k)$ are applied to the filter and provided the initial state of the filter is known at a certain time instant $k_o T$.

As the above-described measures according to the invention relates to the suppression of parasitic oscillations belonging to category II (see section (A)(2)), the information signal waves $a(1,k)$ and $a(2,k)$ are assumed to be constant and their word length is assumed to be equal to that of $b(j,k)$. In what follows hereinafter we shall use the notion "integer". This must be understood to mean a number whose word length is equal to the desired word length. So a sample of a signal wave is an integer if its value can be exactly represented in a code word of the desired length. So the signal waves $a(j,k)$ and $b(j,k)$ where $j = 1,2,\ldots, N$ will be integers but the non-quantized signal waves $b_o(j,k)$ will in general not be integers.

The wave digital filter is first considered to be an "ideal filter"; that is to say in this wave digital filter no quantizing is applied and the storage capacity of the storage sections 2(.) is assumed to be infinitely large. In such a situation it then yields that $b(j,k) = b_o(j,k) = \pm a(j,k+1)$ for $j = 3, \ldots, N$. In the second place it is assumed that constant signal waves $a(j,k)$ where $j = 1, 2$ are applied to this "ideal filter". Assume these constant signal waves to be:

$$a(j,k) = \bar{a}(j) \text{ for } j = 1,2 \quad (7)$$

In what follows herebelow samples of constant signal waves will be indicated with a line above the letter.

In this "ideal filter" having constant input signal waves $\bar{a}(1)$ and $\bar{a}(2)$ also the vector components $a(j,k)$, $b_o(j,k) = b(j,k)$ will be constant in the steady state condition; in other words $\bar{a}(j,k) = \bar{a}(j)$ and $b_o(j,k) = b(j,k) = \bar{b}(j)$. Furthermore for each port $P(j)$ where $j = 3, 4, \ldots, N$, the condition $\bar{a}(j) = \pm \bar{b}(j)$ yields. From expression (5) the set $$\begin{bmatrix} \bar{b}(3) \\ \bar{b}(4) \\ \bar{b}(5) \\ \cdot \\ \cdot \\ \bar{b}(N) \end{bmatrix} = \begin{bmatrix} s_{31} & s_{32} & s_{33} \cdots s_{3N} \\ s_{41} & s_{42} & s_{43} \cdots s_{4N} \\ \cdot & \cdot & \cdot \\ \cdot & \cdot & \cdot \\ \cdot & \cdot & \cdot \\ s_{N1} & s_{N2} & s_{N3} \cdots s_{NN} \end{bmatrix} \begin{bmatrix} \bar{a}(1) \\ \bar{a}(2) \\ \pm \bar{b}(3) \\ \pm \bar{b}(4) \\ \cdot \\ \cdot \\ \pm \bar{b}(N) \end{bmatrix} \quad (8)$$

of linear equations is obtained which uniquely determines the unknowns $\bar{b}(3), \bar{b}(4), \ldots \bar{b}(N)$ for given values of $\bar{a}(1)$ and $\bar{a}(2)$.

If for the "ideal filter" described above it is furthermore assumed that the input signal waves $\bar{a}(1)$ and $\bar{a}(2)$ are integers; and that the N-port adaptor 1 in FIG. 1 is constructed in such a way that in the steady state condition of this "ideal filter" for all possible combinations of integer values of $\bar{a}(1)$ and $\bar{a}(2)$ the output signal wave amplitudes $b_o(j,k)$ where $j = 3, \ldots N$, are equal to $\bar{b}(3), \bar{b}(4), \ldots \bar{b}(N)$ which can be determined by means of the set of equations (8) and assume integer values too, then also the signal waves $\bar{a}(3), \bar{a}(4), \ldots \bar{a}(N)$ become integers. If quantizing means are now introduced then it remains valid in this situation that $b(j,k) = b_o(j,k) = \bar{b}(j)$. This flows from the fact that if the wave samples $b_o(j,k)$ which are applied to the quantizers $Q(j)$ (see FIG. 1) are integers the quantizers function as through-connections only.

In section (E.4) it will be shown that for a large class of wave digital filters in the steady state condition $(b(j,k) = b_o(j,k)$ yields where $j = 1, 2, 3, \ldots N$ and so expression (8) is applicable. As will be shown for these filters the steady state signal wave samples $\bar{b}_o(j,k)$ for $j = 2, 3, \ldots N$ are either equal to zero or equal to the sum or the difference of the wave samples $\bar{a}(1)$ and $\bar{a}(2)$. As $\bar{a}(1)$ and $\bar{a}(2)$ will be integers both the sum and the difference of these wave samples is integer.

(E.3) Stabilizing the wave digital filter by means of controlled rounding

In the first place "difference vectors" are introduced which are defined as follows:

$$\alpha(k) = a(k) - \bar{a}$$
$$\beta(k) = b(k) - \bar{b}$$
$$\beta_o(k) = b_o(k) - \bar{b} \quad (9)$$

Herein $\bar{a}$ and $\bar{b}$ respectively represent constant vectors with the respective components $\bar{a}(j)$ and $\bar{b}(j)$ which indicate the constant input and output signal waves of the port. $P(j) j = 3, 4, \ldots, N$ in the steady state condition of the ideal filter if constant information signal waves $\bar{a}(1)$ and $\bar{a}(2)$ are applied thereto. The expressions (3), (5) and (6) may now be written as follows:

$$\beta(j,k) = \tilde{Q}_j[\beta_o(j,k)] \quad (10)$$

$$\beta_o(k) = s \cdot \alpha(k) \quad (11)$$

$$\alpha(j,k) = \pm \beta(j,k-1) \text{ for } j = 3, 4, \ldots N \quad (12)$$

In section E(2) it is shown that the expressions (5) and (6) are not only satisfied by the vectors $a(k)$, $b(k)$ and $b_o(k)$, but also by the constant vectors $\bar{a}$, $\bar{b}$ and $\bar{b}$. Since the relations (5) and (6) are linear relations also the difference vectors $\alpha(k)$, $\beta(k)$ and $\beta_o(k)$ satisfy them. The non-linear quantization operation $Q_j(.)$ must, however, be transformed into a new operation $\tilde{Q}_j(.)$ which is defined by expression (10).

As we are only interested in the behavior of the filter at constant input signals that is to say $a(1,k) = \bar{a}(1)$ and $a(2,k) = \bar{a}(2)$, the components $\alpha(1,k)$ and $\alpha(2,k)$ of the new vectors $\alpha(k)$ are identically zero. This system of comparisons (10), (11) and (12) is identical to the system of comparisons for a wave digital filter to which no data signal waves are applied.

As indicated in section (A) (2) and reference 5, in a wave digital filter to which no information signal waves are applied the parasitic oscillations are suppressed if the quantizer $Q(j)$ processes the non-quantized signal waves $\beta_o(j,k)$ in such a way that:

$$|\beta(j,k)| \leq |\beta_o(j,k)| \quad (13)$$

In the wave digital filter considered, the information signal waves $a(1,k)$ and $a(2,k)$ have constant values $\bar{a}(1)$ and $\bar{a}(2)$ respectively and the signal waves $\beta(j,k)$ and $\beta_o(j,k)$ are given by expression (9), it now applies that parasitic oscillations are suppressed if the quantizers $Q(j)$ perform such a quantizing that:

$$|b(j,k) - \bar{b}(j)| \leq |b_o(j,k) - \bar{b}(j)| \quad (14)$$

This means that $b_o(j,k)$ must be rounded such that the rounded value $b(j,k)$ is closer to (or at least not farther from) $\bar{b}(j,k)$ than $b_o(j,k)$.

Comparing the expressions (2) and (14) it can be concluded that in the steady state condition of the wave digital filter having constant signal waves $\bar{a}(1)$ and $\bar{a}(2)$ applied thereto, the output signal wave $\bar{b}(j)$ will be equal to a linear combination of $\bar{a}(1)$ and $\bar{a}(2)$. This means that $\bar{b}(j) = c(1,j)\bar{a}(1) + c(2,j)\bar{a}(2)$. In chapter (E.4) it will be indicated that for purely capacitive ports of highpass and bandpass filters this relation is indeed satisfied.

(E.4) DETERMINING THE CONSTANT SIGNAL WAVES $\bar{b}(j)$

As known, in a wave digital filter the wave amplitudes are related to the voltages $v(j,k)$ and the currents $i(j,k)$ of the reference filter according to reference 2.

$$a(j,k) = v(j,k) + R(j)i(j,k) \quad (15)$$

$$b_o(j,k) = v(j,k) - R(j)i(j,k)$$

In the steady state condition of the "ideal filter" these equations read as:

$$\bar{a}(j) = \bar{v}(j) + R(j)\bar{i}(j) \quad (16a)$$

$$\overline{b}(j) = \overline{v}(j) - R(j)\overline{i}(j) \tag{16b}$$

If it is now assumed that in the reference filter voltage sources supplying voltage $a(1)$ and $e(2)$ respectively are connected to the ports $P(1)$ and $P(2)$ in series with resistances $R(1)$ and $R(2)$ respectively then the following equation is obtained from (16a):

$$\overline{a}(j) = \overline{e}(j) \text{ for } j = 1, 2 \tag{17}$$

For a capacitive port of the "ideal filter" it follows that now $\overline{a}(j) = \overline{b}(j)$ and $R(j) = 1/C(j)$. This means that $\overline{i}(j) = 0$ (see expressions (16a) and (16b)), so that:

$$\overline{b}(j) = \overline{v}(j) \tag{18}$$

For an inductive port of the "ideal filter" it follows that: $\overline{a}(j) = -\overline{b}(j)$ and $R(j) = L(j)$. This means that $\overline{v}(j) = 0$ (see expressions (16a) and (16b)) so that:

$$\overline{b}(j) = -L(j)\overline{i}(j) \tag{19}$$

From the above it follows that the values of $\overline{b}(j)$ can be determined from the values of the voltages and the currents in the reference filter if the latter is in the steady state condition.

A wave digital filter, having practically no limit cycles when constant amplitude information signals waves $a(1,k)$ and $a(2,k)$ are applied thereto can only be realized if in the steady state condition of the "ideal filter" the waves $\overline{b}(j)$ can be represented by an integer. In that case, in the non-ideal filter $\overline{b}(j) = b_o(j,k) = b(j,k)$ holds. From the equations (18) and (19) it now follows that $\overline{v}(j)$ and $L(j)\overline{i}(j)$ must be integers. This is indeed the case for highpass and bandpass filters as will now be made clear.

Figure 2:
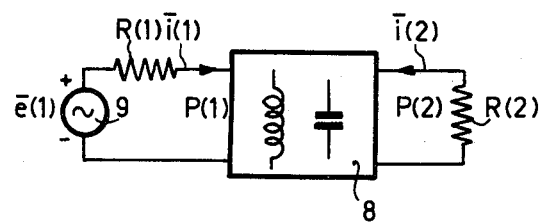
FIG. 2 shows diagrammatically a reference filter and its connection to a source and a load.

In FIG. 2 reference number 8 represents a reference filter having ports $P(1)$ and $P(2)$. For simplicity it is assumed that $\overline{a}(2) = \overline{e}(2) = 0$. Furthermore, a series arrangement of a source 9 and a resistor $R(1)$ is connected to the port $P(1)$ while port $P(2)$ comprises a load resistance $R(2)$. The source 9 produces a constant signal wave $\overline{e}(1)$ which may be represented as an integer. For the equivalent wave digital filter the equation (2) now reads:

$$|b(3,k)-c(1,3)a(1,k)| \leq |b_o(3,k)-c(1,3)a(1,k)|.$$

Many highpass and bandpass filters are characterized in that $\overline{i}(1) = \overline{i}(2) = 0$ (see FIG. 2) As in this type of filters $\overline{i}(1) = 0$, no currents flow at all in these filters on the one hand. This means that $L(j)\overline{i}(j) = 0$. For these inductive ports $\overline{b}(j) = 0$ and consequently $\overline{b}(j)$ is an integer. In the steady state therefore $b(j,k) = b_o(j,k) = \overline{b}(j) = 0$. To attain this steady state value it suffices to design the quantizers $Q(j)$ for these inductive ports as "magnitude truncaters". On the other hand the capacitances in this type of filter are charged to a voltage $\overline{v}(j) = \pm \overline{e}(1)$ or to the voltage $\overline{v}(j) = 0$. This means that for a capacitive port:

$$\overline{b}(j) = +\overline{e}(1) \text{ or } \overline{b}(j) = -\overline{e}(1) \text{ or } \overline{b}(j) = 0$$

As $\overline{e}(1)$ represents quantized samples of a constant signal wave, $\overline{e}(1)$ therefore is an integer so that for each capacitive port $\overline{b}(j)$ is also an integer. Therefore, in the steady state condition the output signal wave of a capacitive port is given by $b(j,k) = b_o(j,k) = \overline{b}(j)$. Depending on the place of the capacitance in the reference filter the constant $c(1,3)$ in expressions (2) is consequently equal to either $+1$, or $-1$, or 0. If $c(1,3) = 0$ then it is sufficient to apply "magnitude truncation" for such a capacitive port to reach the steady state condition.

The capacitive ports which are found in the wave digital filter and which are related to those capacitances of the reference filter which in general (for example $e(1) \neq 0$ and $e(2) \neq 0$) will be charged to a voltage $\overline{v}(j) = c(1,3) \overline{e}(1) + c(2,3)\overline{e}(2)$ in which $c(1,3)$ and $c(2,3)$ each exclusively assume the values $+2$, $-1$ or 0 and whereby $c(1,3)$ and $c(2,3)$ are not simultaneously zero are already referred to as "purely capacitive port" hereinbefore. This in contradistinction to those capacitive ports resulting from those capacitances where capacitive voltage divisions of $\overline{e}(1)$ and/or $\overline{e}(2)$ take place, resulting in fractional number constants $c(1,3)$ and/or $c(2,3)$.

The description of the wave digital filter given in the preceding sections E(2)-E(4) is based on voltage waves (see reference 2). However, the preceding fully applies for current waves (see also reference 2). In this latter case, however, the preceding description should be modified in such a way that inductance should be read for capacitance and vice versa, voltage source should read current source and series arrangement should read parallel circuit and vice versa. Expression (2) then indicates how the output signal wave of a purely inductive port must be rounded; in other words controlled rounding is now applied to the purely inductive ports.

THE CONCRETE EMBODIMENT OF THE FIGS. 3 AND 4

Figure 3:
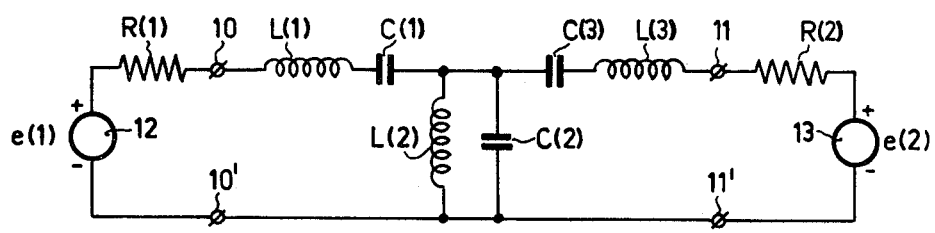
FIG. 3 shows a concrete embodiment of a reference filter.

FIG. 3 shows a bandpass reference filter. This reference filter is connected between the pairs of input and output terminals 10, 10' and 11, 11' respectively. As shown in this FIG. 3, this filter comprises the inductions $L(1)$, $L(2)$ and $L(3)$ and the capacitances $C(1)$, $C(2)$ aND $C(3)$. The series arrangement of a voltage source 12 and a resistor $R(1)$ is connected to the input terminals 10, 10'. A series arrangement of a voltage source 13 and a resistor $R(2)$ is also connected to the output terminals 11, 11'. The voltage sources 12 and 12 produce the signals $e(1)$ and $e(2)$ respectively.

If $e(1)$ and $e(2)$ are constant signals then the various currents and voltages through and across the elements in the steady state condition are: as follows:

the current through $L(8)$ is zero.
the voltage across $C(1)$ is equal to $-e(1)$
the current through $L(2)$ is zero
the voltage across $C(2)$ is zero
the voltage across $C(3)$ is equal to $-e(2)$
the current through $L(3)$ is zero.

Figure 4:
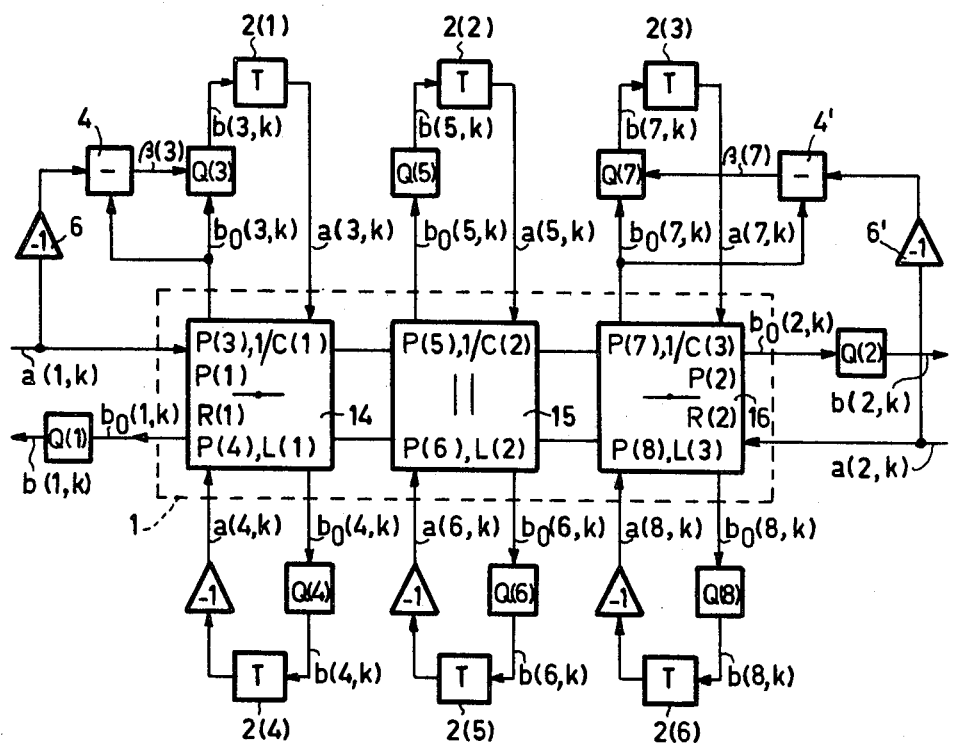
FIG. 4 the wave digital filter equivalent of the filter of FIG. 3.

FIG. 4 shows a wave digital filter which comprises the bandpass filter of FIG. 3 as reference filter. This wave digital filter comprises an 8-port adaptor 1 which, in this embodiment, is constituted by a cascade arrangement of three 4-port adaptors 14, 15 and 16. The adaptors 14 and 16 are of the series type (series-adaptor), the adaptor 15 is a parallel adaptor. These adaptors may be designed according to the concept described in reference 2. This wave digital filter further is designed in the same manner as the wave digital filter of FIG. 2 and the components in FIG. 4 which correspond to components of FIG. 1 have been given the same reference numerals as in FIG. 1. It should be noted that the ports $P(4)$, $P(6)$ and $P(8)$ represent inductive ports having the port impedances $L(1)$, $L(2)$ and $L(3)$ respectively. For these inductive ports the output code words of the delay sections 2(4), 2(5) and 2(6) are multiplied by a factor −1, and the product code words a(4,k), a(6,k) and a(8,k) are again applied to the adaptor 1. The ports P(3), P(5) and P(7) represent the capacitive ports having the port impedances 1/C(1), 1/C(2), 1/C(3), respectively. The ports P(3) and P(7) are purely capacitive ports. Because in the reference filter of FIG. 3 the voltage across C(1) is equal to $\bar{v}(3) = c(1,3)\bar{e}(1)+c(2,3)\bar{e}(2) = -\bar{e}(1)$ and the voltage across C(3) is equal to: $\bar{v}(7) = -\bar{e}(2)$. "Controlled rounding" described above is only applied now to these capacitive ports P(3) and P(7). The ports therefore comprise the control circuits 4,6 and 4′,6′ shown in FIG. 4. More particularly the port constants for the port P(3) are equal to:
$c(1,3) = -1; c(2,3) = 0$, and the port constants for the port P(7) are equal to: $c(1,7) = 0; c(2,7) = -1$. As in the steady state condition of the reference filter the voltage across the capacitance C(2) as well as the currents through the inductions are equal to zero, also the waves $b(4,k)$, $b(5,k)$, $b(6,k)$ and $b(8,k)$ must be equal to zero. Therefore the quantizers Q(4), Q(5) and Q(6) and Q(8) again are "magnitude truncation" devices. It should be noted that the devices Q(1) and Q(2) may have any quantizing characteristic. As the signal waves $b(1,k)$ and $b(2,k)$ are not fed back into the filter these waves do not affect the behavior of this filter.

THE QUANTIZER ARRANGED FOR "CONTROLLED ROUNDING"

Figure 5:
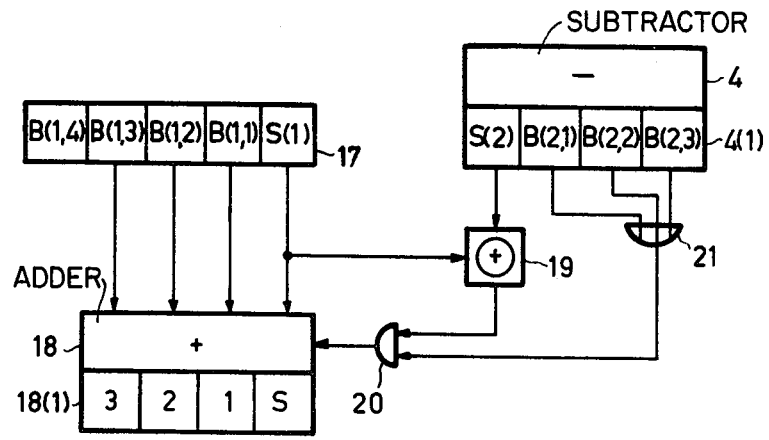
FIG. 5 shows a quantizing device for applying "controlled rounding"

FIG. 5 shows an embodiment of a quantizer Q(j) which is arranged for controlled rounding. This figure shows symbolically the subtractor 4 provided with an output register 4(1). Reference 17 represents a register in which a signal wave sample $b_o(j,k)$ to be quantized is stored. This register 17 may be constituted by an input register of the quantizer or by the output register of an adder or multiplier which is present in the relevant adapter and which supplies the signal wave samples $b_o(j,k)$. For simplicity it is assumed that the adder 4 supplies four-bit code words and that $b_o(j,k)$ is a five-bit code word. These code-words are given in sign and magnitude representation. Consequently the register 17 comprises five register sections which are only shown symbolically by S(1), B(1,1) - B(1,4). In a corresponding manner a register 4(1) comprises four register sections which are symbolically indicated by S(2), B(2,1), B(2,2) and B(2,3). Herein S(1) represents the polarity bit of $b_o(j,k)$; S(2) represents the polarity bit of $\beta(j)$; B(1,1) − B(1,4) the magnitude bits of $b_o(j,k)$ and B(2,1) − B(2,3) the magnitude bits of $\beta(j)$. These magnitude bits B(r,1) − B(r,4) where $r = 1$ or 2 represent the values: $(\frac{1}{2})^1$, $(\frac{1}{2})^2$, $(\frac{1}{2})^3$, $(\frac{1}{2})^4$ respectively.

In the embodiment shown the code word $b_o(j,k)$ in the register 17 which consists of four magnitude bits is converted into a code word which only consists of three magnitude bits. To that end those register sections of the register 17 which contain the bit S(1), B(1,1), B(1,2) and B(1,3) are connected in parallel with the input circuit of an adder 18 which is provided which an output register 18(1). Furthermore, the polarity bits S(1) and S(2) are applied to a module-2-adder 19 whose output is connected through an AND-gate 20 to the least significant bit input of the second input circuit of the adder 18. To the AND-gate 20 also the output signal of an OR-gate 21 is applied to which OR-gate the bits B(2,1), B(2,2) and B(2,3) which are stored in the register 4(1) are applied. If all bits B(2,i), where $i = 1, 2, 3$ have the value zero which means that if $\beta(j) = 0$ the AND-gate 21 is blocked. If on the contrary at least one of the bits B(2,i) where $i = 1, 2, 3$ is not equal to zero and so $\beta(j) \neq 0$ then this AND-gate 20 is not blocked and the output signal of the modulo-2-adder can be applied to the least significant bit input of the second input circuit of the adder 18.

If now the sign of a positive number is represented by an "0"-bit, that of a negative number by an "1"-bit, if, furthermore, the number characterized by the bits B(1,1), B(1,2), B(1,3) is represented by M, one quantizer stage by $q(=(\frac{1}{2})^3)$, and the magnitude of the quantizer output code word of the quantizer, which is stored in the register 18(1) by $|b(j,k)|$, then the operation of the quantizer shown in FIG. 5 is shown by the table below if $\beta(j) \neq 0$. It should be noted that the sign of the code word $b_o(j,k)$ to be quantized is not changed by the quantization so that the sign of $b(j,k)$ is equal to S(1).

| (S(1)) | S(2) | \|b(j,k)\| |
|---|---|---|
| 0 | 0 | M |
| 0 | 1 | M + q |
| 1 | 0 | M + q |
| 1 | 1 | M |

If $\beta(j) = 0$ no quantizing step $q$ is added to the value of M for any combination of the polarity bits S(1) and S(2).

EXTENSION OF THE FIELD OF APPLICATION OF "CONTROLLED ROUNDING"

In the preceding sections it was shown that a wave digital filter can be made perfectly free from limit cycles by the use of controlled rounding. However, a number of restrictions were introduced at the same time. Namely, controlled rounding could only be applied if the DC component of the input signal can or must be suppressed. This is, for example, the case with band and highpass filters. Furthermore, controlled rounding is only possible with purely capacitive or purely inductive ports. However, in practice the latter limitation is of very little importance, because most highpass and bandpass filters can be converted when suitable transformations are chosen into reference filters having a wave digital filter counter part, in which the capacitive ports are purely capacitive, or into reference filters, having a wave digital filter counter part, in which the inductive ports are purely inductive.

The first-mentioned limitation, however, is of a much more serious nature. It means that a wave digital filter having a lowpass-transfer characteristic is not free from limit cycles if the constant information signal wave, which is unequal to zero is applied thereto. With such a wave digital filter "controlled rounding" is only possible to a limited degree, because in case voltage waves are considered, in the reference filter, on the one hand a direct current must be able to flow through inductions and, on the other hand, the capacitive ports are not all "purely capacitive".

If, however, a wave digital filter having a transfer characteristic with suppressed DC-component, is free from limit cycles, also due to the use of controlled rounding then also the signal wave which is constituted by a linear combination of signal waves present in the wave digital filter, is free from limit cycles. If now this signal wave is considered as an output signal wave of a digital signal processing arrangement which, besides at least one wave digital filter comprises means for linearly combining signal waves present in the wave digital filter and, possibly, the information signal wave, then this output signal wave is at all times free from limit cycles, independent of the transfer characteristic of the signal processing device.

Figure 6:
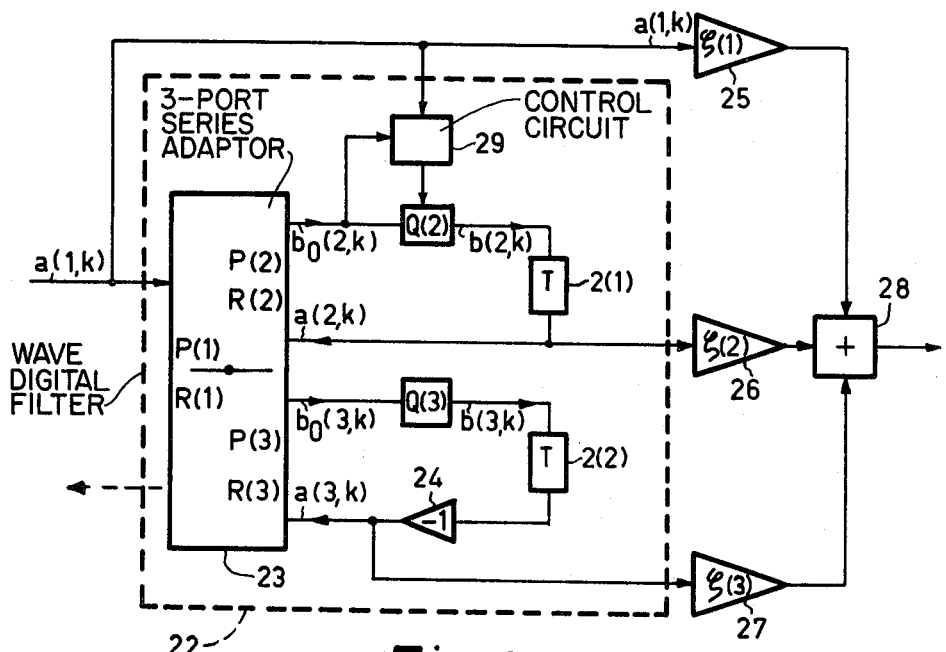
FIG. 6 shows a second order digital filter comprising a wave digital filter in which the quantizing means are arranged for applying controlled rounding.

FIG. 6 shows an embodiment of such a digital signal processing device in the form of a second order recursive digital filter with a lowpass transfer characteristic. This filter is constituted by a wave digital filter 22, comprising a 3-port series-adapter 23 with ports P(1), P(2) and P(3). Herein the port P(2) is purely capacitive with port resistance 1/C. The port P(3) is an inductive port with port resistance L. The port P(1) has a port resistance R(1) and the data signal wave $a(1)$ is applied to this port in the form of a voltage wave. Furthermore, in this wave digital filter the capacitive port P(2) comprises a quantizer Q(2) and the inductive port P(3) is on the one hand provided with a quantizer Q(3) and on the other hand with a multiplier 24 which is arranged for reversing the polarity of the output signal wave of the delay section 2(2).

The output signal wave of the filter is constituted in a manner shown in the figure by a linear combination of the input signal wave $a(1)$ and the signal waves $a(2)$ and $a(3)$. More particularly the output signal wave is $\phi(1).a(1,k) + \phi(2).a(2,k) + \phi(3).a(3,k)$. In the figure the elements 25, 26 and 27 represent multipliers which multiply the signal waves supplied thereto by a factor $\phi(1)$, $\phi(2)$ and $\phi(3)$ respectively. Element 28 represents an adder.

Figure 7:
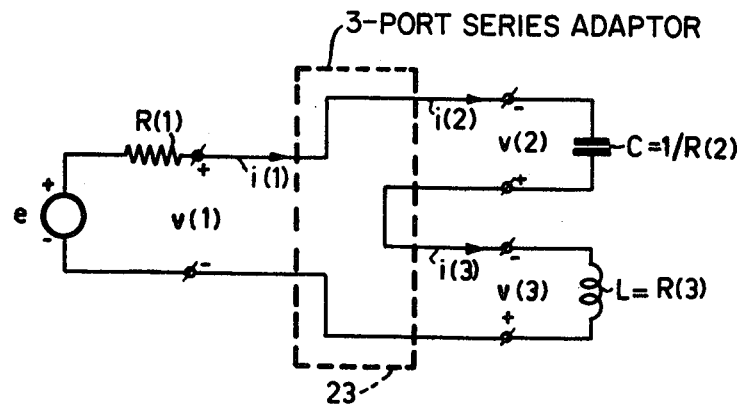
FIG. 7 shows a reference filter for the wave digital filter used in FIG. 6.

The RLC network shown in FIG. 7 is the reference filter for the wave digital filter 22. With such a network all desired poles of the transfer characteristic can be realized. Furthermore all the requirements mentioned in the preceding sections can be satisfied by means of such a network. In the steady state condition, no direct current flows through this network; this means that $b(3) = 0$. Since $\bar{b}(3) = 0$, $\bar{b}(2) = -\bar{a}(1) = -\bar{e}$. The minus sign is a result of the assumption of the voltage polarities which is such that $\Sigma v_i = 0$ (cf. FIG. 7). The result of the above is that in the wave digital filter of FIG. 6 $b_o(3,k)$ must be rounded downwards to zero. The quantizer Q(3) is consequently again designed as a "magnitude truncator". The signal wave $b_o(2,k)$ must be rounded into the direction of $-\bar{a}(1) = \bar{e}$. Consequently controlled rounding is again performed on the signal wave $b_o(2,k)$. To that end the quantizer Q(2) is, for example, designed in the manner shown in FIG. 5 and it is controlled by the control circuit 29 which is designed in a manner such as, for example, shown in FIG. 4.

Figure 8:
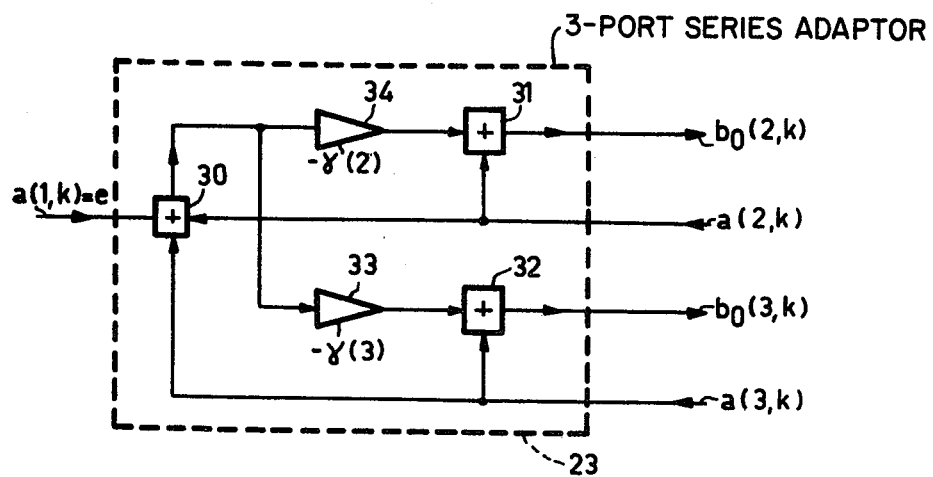
FIG. 8 shows a detailed constructive of the three-port adapter for use in the wave digital filter of FIG. 6.

For completeness, FIG. 8 shows an embodiment of a 3-port adaptor which can be used in FIG. 6. This embodiment can be obtained by using the theory described in reference (2). This adaptor comprises three adders 30-32 and two multipliers 33 and 34 which multiply the numbers applied thereto by the factors $-\gamma(2)$ and $-\gamma(3)$. These adders and multipliers are interconnected in the manner shown in the figure.

It follows from reference (2) that this 3-port series-adapter in general satisfies the following S-matrix:

$$S = \begin{bmatrix} 1 - \gamma(1) & -\gamma(1) & -\gamma(1) \\ -\gamma(2) & 1 - \gamma(2) & -\gamma(2) \\ -\gamma(3) & -\gamma(3) & 1 - \gamma(3) \end{bmatrix} \quad (20)$$

where $$\gamma(k) = \frac{2R(k)}{\left[\sum_{i=1}^{3} R(i)\right]} \text{ and } \sum_{k=1}^{3} \gamma(k) = 2 \quad (21)$$

It follows from expression (21) that the $\gamma(k)$ are not independent. As in the embodiment of FIG. 8 $\gamma(1)$ is not explicitly realized the port P(1) is called the dependent port. It should be noted that there are two other possible embodiments for this 3-port adaptor which all satisfy the S-matrix of expression (20) and in which either the port P(2) or the port P(3) is considered as the dependent port. In principle these three embodiments are equivalent.

The transfer characteristic of the signal processing device shown in FIG. 6 can now be determined by means of the Mason theorem (see reference 8). The transfer characteristic is given by the expression:

$$H(z) = \frac{cz^2 + dz + e}{z^2 + az + b} \quad (22)$$

where $$a = \gamma(2) - \gamma(3) \quad (23a)$$

$$b = \gamma(2) + \gamma(3) - 1 \quad (23b)$$

$$c = \zeta(1) \quad (23c)$$

$$d = \gamma(3) \cdot \zeta(3) - \gamma(2) \cdot \zeta(2) + \gamma(2) \cdot \zeta(1) - \gamma(3) \cdot \zeta(1) \quad (23d)$$

$$e = [\gamma(2) + \gamma(3) - 1] \cdot \zeta(1) - \gamma(2) \cdot \zeta(2) - \gamma(3) \cdot \zeta(3) \quad (23e)$$

As will be clear from these expressions (23), the denominator of H(z) is only determined by the coefficients $\gamma(2)$ and $\gamma(3)$ that is to say by the wave digital filter of FIG. 6. From the above it follows that with the network shown in FIG. 6 all the desired poles and zeros of the transfer characteristic can be obtained so that any second order transfer function can be stably realized with this network.

It should be noted that to realize any higher order transfer characteristic it is sufficient to connect a plurality of second order recursive digital filters having the configuration shown in FIG. 6 in cascade.

It should also be noted that linear combinations of $a(2,k)$, and $b(2,k)$ or $a(3,k)$ and $b(3,k)$ may be applied to the multipliers 26 and 27 instead of the signal waves $a(2,k)$ and $a(3,k)$ respectively.

Finally it should be noted that in FIG. 6 a parallel-adaptor may be used instead of a series-adaptor. Furthermore it is possible to use an N-port adaptor with N > 3 instead of a 3-port adaptor.

(I) General Remarks

In the embodiments described it is assumed that the signal waves $b_o(j,k)$ to be quantized are explicitly present in the wave digital filter. However, the "controlled rounding" prescription as indicated in expression (2) can also be satisfied by applying quantization to those signal waves, the linear combination of which results in $b_o(j,k)$. For example, in the 3-port series-adaptor shown in FIG. 8 controlled rounding can be applied to the output signal waves of the multipliers 33 and 34. In this case $b_o(j,k)$ is supposed to be implicitly present.

What is claimed is:

1. A digital signal processing arrangement comprising at least one wave digital filter including at least one N-port adaptor with ports P($i$), ($i = 1, 2, \ldots N$), each port including an input and an output, at least one of the ports P($i$) being of the purely capacitive type;
- means connected to said filter for supplying digital information signal waves $a(1,k)$, $a(2,k)$, $\ldots a(r,k)$ through the input of each of $r$ ports ($r < N$);
- means connected to said filter for supplying auxiliary digital signal waves $a(i,k)$, where $i = r+1, \ldots N$, through the input of each of the remaining ports; and
- quantizing means connected to the output of each of said ports P($j$), ($j = 1, 2, \ldots N$), for producing a digital output signal wave $b(j,k)$ quantized at a predetermined wordlength, said quantizing means producing at each of said purely capacitive ports P($i$) a digital output signal wave $b(j,k)$ such that each $b(j,k)$ satisfies the relationship $$|b(j,k) - \sum_{i=1}^{r} c(i,j)a(i,k)| \leq |b_o(j,k) - \sum_{i=1}^{r} c(i,j)a(i,k)|$$

in which $c(n,j)$, with $n = 0, 1, 2, \ldots r$, represents a constant characteristic of the $j^{th}$ purely capacitive port, and $b_o(j,k)$ represents a non-quantized version of the digital output signal wave $b(j,k)$.

2. A digital signal processing arrangement as claimed in claim 1, wherein said quantizing means comprises a quantizer Q($j$) which is connected to each of the purely capacitive ports; a control circuit S($j$) connected to the corresponding quantizer Q($j$) and producing a digital control signal $\beta(j)$; the signal wave $b_o(j,k)$ which is produced by the N-port adaptor being applied to said quantizer;
- said quantizer Q($j$) rounding $b_o(j,k)$ either upwards or downwards depending upon the polarity of the control signal $\beta(j)$.

3. A digital signal processing arrangement as claimed in claim 2, wherein each of said control circuits S($j$) comprises linear subtracting means for producing said control signal $\beta(j)$, the relation between $\beta(j)$ and the digital data signal waves $a(i,k)$, ($i = 1, 2, \ldots r$), being given by the relationship $$\beta(j) = b_o(j,k) - \sum_{i=1}^{r} c(i,j)a(i,k).$$

4. A digital signal processing arrangement as claimed in claim 1, further comprising multiplying means and adder means connected to ports of said digital filter for producing an output signal wave $y(k)$, the relation between this output signal wave and the signal waves produced in the wave digital filter being given by the relation $$y(k) = \sum_{i=1}^{n} \phi(i)a(i,k) + \sum_{j=1}^{n} \phi(j)b(j,k)$$

in which $\phi(i)$ and $\phi(j)$ represent the constants determined by the transfer characteristic.

5. A digital signal processing arrangement comprising at least one wave digital filter including at least one N-port adaptor with ports P($i$), ($i = 1, 2, \ldots N$), each port including an input and an output, at least one of the ports P($i$) being of the purely inductive type;
- means connected to said filter for supplying digital information signal waves $a(1,k)$, $a(2,k)$, $\ldots a(r,k)$ through the input of each of $r$ ports ($r < N$);
- means connected to said filter for supplying auxiliary digital signal waves $a(i,k)$, where $i = r+1, \ldots N$, through the input of each of the remaining ports; and
- quantizing means connected to the output of each of said ports P($j$), ($j = 1, 2, \ldots N$), for producing a digital output signal wave $b(j,k)$ quantized at a predetermined wordlength, said quantizing means producing at each of said purely inductive ports P($i$) a digital output signal wave $b(j,k)$ such that each $b(j,k)$ satisfies the relationship $$|b(j,k) - \sum_{i=1}^{r} c(i,j)a(i,k)| \leq |b_o(j,k) - \sum_{i=1}^{r} c(i,j)a(i,k)|$$

in which $c(n,j)$, with $n = 0, 1, 2, \ldots r$, represents a constant characteristic of the $j^{th}$ purely inductive port, and $b_o(j,k)$ represents a non-quantized version of the digital output signal wave $b(j,k)$.

6. A digital signal processing arrangement as claimed in claim 5, wherein said quantizing means comprises a quantizer Q($j$) which is connected to each of the purely inductive ports; a control circuit S($j$) connected to the corresponding quantizer Q($j$) and producing a digital control signal $\beta(j)$; the signal wave $b_o(j,k)$ which is produced by the N-port adaptor being applied to said quantizer;
- said quantizer Q($j$) rounding $b_o(j,k)$ either upwards or downwards depending upon the polarity of the control signal $\beta(j)$.

7. A digital signal processing arrangement as claimed in claim 6, wherein each of said control circuits S($j$) comprises linear subtracting means for producing said control signal $\beta(j)$, the relation between $\beta(j)$ and the digital data signal waves $a(i,k)$, ($i = 1, 2, \ldots r$), being given by the relationship $$\beta(j) = b_o(j,k) - \sum_{i=1}^{r} c(i,j)a(i,k).$$

8. A digital signal processing arrangement as claimed in claim 5, further comprising multiplying means and adder means connected to ports of said digital filter for producing an output signal wave $y(k)$, the relation between this output signal wave and the signal waves produced in the wave digital filter being given by the relation $$y(k) = \sum_{i=1}^{n} \phi(i)a(i,k) + \sum_{j=1}^{n} \phi(j)b(j,k)$$

in which $\phi(i)$ and $\phi(j)$ represent the constants determined by the transfer characteristic.

* * * * *